United States Patent
Hsieh (10) Patent No.: US 6,947,295 B2
(45) Date of Patent: Sep. 20, 2005

(54) BALL GRID ARRAY PACKAGE WITH AN ELECTROMAGNETIC SHIELD CONNECTED DIRECTLY TO A PRINTED CIRCUIT BOARD

(75) Inventor: Chia-Ming Hsieh, Ping-Tung Hsien (TW)

(73) Assignee: Benq Corporation, Tao-Yuan Hsien (TW)

( * ) Notice: Subject to any disclaimer, the term of this patent is extended or adjusted under 35 U.S.C. 154(b) by 0 days.

(21) Appl. No.: 10/761,724

(22) Filed: Jan. 20, 2004

(65) Prior Publication Data

US 2004/0150977 A1 Aug. 5, 2004

(30) Foreign Application Priority Data

Jan. 20, 2003 (TW) ..................................... 92200989 U (51) Int. Cl.[7] .............................. H05K 9/00; H05K 7/02
(52) U.S. Cl. ....................... 361/818; 361/800; 361/816; 361/752; 361/760; 174/35 R; 174/35 GC; 174/260
(58) Field of Search ................................ 361/752, 800, 361/816, 818, 760, 772, 777; 174/35 R, 35 GC, 250, 260, 255; 257/678, 659, 660

(56) References Cited

U.S. PATENT DOCUMENTS

| 5,355,016 A | * | 10/1994 | Swirbel et al. ............. 257/659 |
| 5,400,949 A | * | 3/1995 | Hirvonen et al. ....... 228/180.22 |
| 5,548,084 A | * | 8/1996 | Tracy ........................ 174/35 R |
| 5,694,300 A | * | 12/1997 | Mattei et al. ................ 361/818 |
| 5,838,551 A | * | 11/1998 | Chan .......................... 361/818 |
| 5,886,876 A | * | 3/1999 | Yamaguchi ................. 361/767 |
| 6,297,967 B1 | * | 10/2001 | Davidson et al. ........... 361/800 |
| 6,362,516 B1 | * | 3/2002 | Waters ....................... 257/678 |
| 6,472,724 B1 | * | 10/2002 | Matsuzawa et al. ........ 257/659 |
| 6,826,053 B2 | * | 11/2004 | Kato et al. .................. 361/715 |
| 6,881,896 B2 | * | 4/2005 | Ebihara ................. 174/35 GC |
| 6,882,040 B2 | * | 4/2005 | Hosoya ...................... 257/699 |

* cited by examiner

Primary Examiner—Randy Gibson
Assistant Examiner—Dameon E. Levi
(74) Attorney, Agent, or Firm—Ladas & Larry LLP (57) ABSTRACT

A ball grid array package includes a chip having a substrate with a bottom surface, a plurality of solder bumps projecting outwardly from the bottom surface of the substrate, and an electromagnetic shield including a housing that defines an inner space which receives the chip and the solder bumps therein, and a bottom opening for access into the inner space. The solder bumps project outwardly of the inner space through the bottom opening in the housing.

7 Claims, 9 Drawing Sheets

BALL GRID ARRAY PACKAGE WITH AN ELECTROMAGNETIC SHIELD CONNECTED DIRECTLY TO A PRINTED CIRCUIT BOARD

CROSS-REFERENCE TO RELATED APPLICATION

This application claims priority of Taiwanese application No. 092200989, filed on Jan. 20, 2003.

BACKGROUND OF THE INVENTION

1. Field of the Invention

This invention relates to a ball grid array package, more particularly to a ball grid array package with an electromagnetic shield connected directly to a printed circuit board.

2. Description of the Related Art

Figure 1:
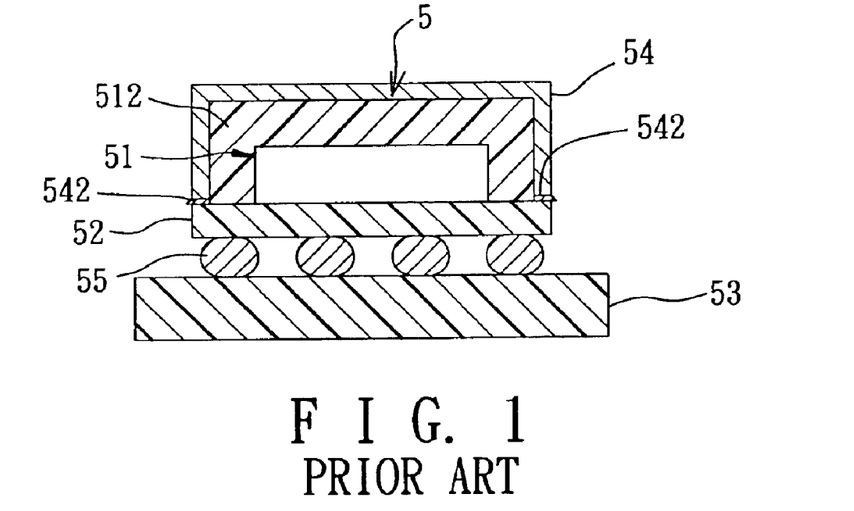
FIG. 1 is a sectional view showing a conventional ball grid array package connected electrically to a printed circuit board.

FIG. 1 illustrates a conventional ball grid array (BGA) package that includes a chip 5 having a substrate 52 and a semiconductor die 51 mounted on the substrate 52 and enclosed by an encapsulant 512 of an insulating material. An electromagnetic shield 54 is provided to enclose the encapsulant 512 so as to minimize electromagnetic interference on the die 51. The electromagnetic shield 54 includes a housing that has a bottom end 542 connected to the substrate 52 by welding. The BGA package is connected electrically to a printed circuit board 53 through a plurality of solder bumps 55 which are formed on a bottom surface of the substrate 52.

The conventional BGA package is disadvantageous in that impacts or stress applied to the electromagnetic shield 54 is transmitted to the printed circuit board 53 through the solder bumps 55, which can result in material fatigue or damage to the solder bumps 55, which, in turn, shortens the service life of the solder bumps 55.

SUMMARY OF THE INVENTION

Therefore, the object of the present invention is to provide a ball grid array package with an electromagnetic shield connected directly to a printed circuit board so as to overcome the aforesaid drawbacks of the prior art.

According to the present invention, there is provided a ball grid array package that includes: a chip including a substrate with a bottom surface; a plurality of solder bumps projecting outwardly from the bottom surface of the substrate; and an electromagnetic shield including a housing that defines an inner space which receives the chip and the solder bumps therein, and a bottom opening for access into the inner space. The solder bumps project outwardly of the inner space through the bottom opening in the housing.

BRIEF DESCRIPTION OF THE DRAWINGS

In drawings which illustrate embodiments of the invention.

DETAILED DESCRIPTION OF THE PREFERRED EMBODIMENTS

For the sake of brevity, like elements are denoted by the same reference numerals throughout the disclosure.

Figure 2:
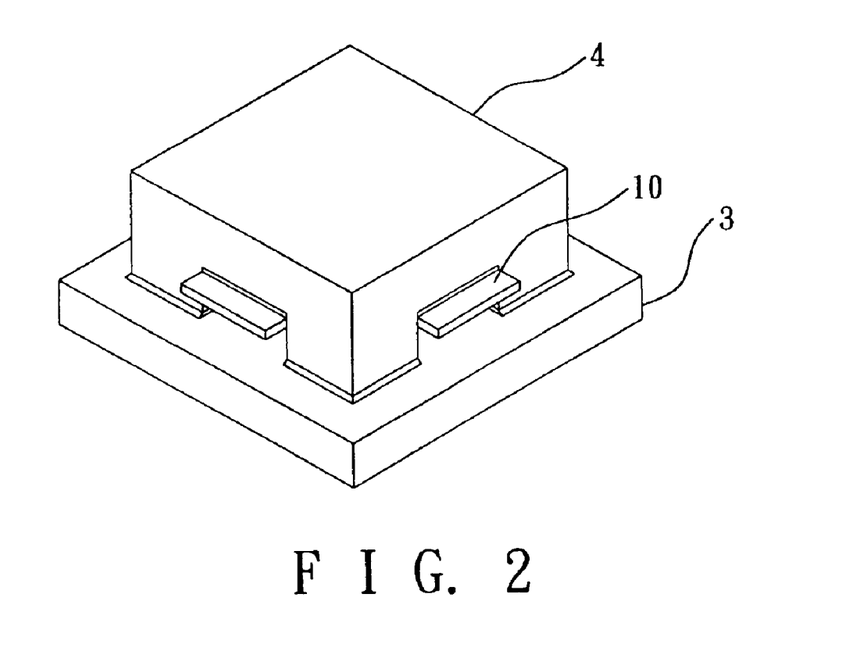
FIG. 2 is a schematic perspective view of the first preferred embodiment of a ball grid array package according to the present invention, with a printed circuit board connected electrically thereto.
Figure 3:
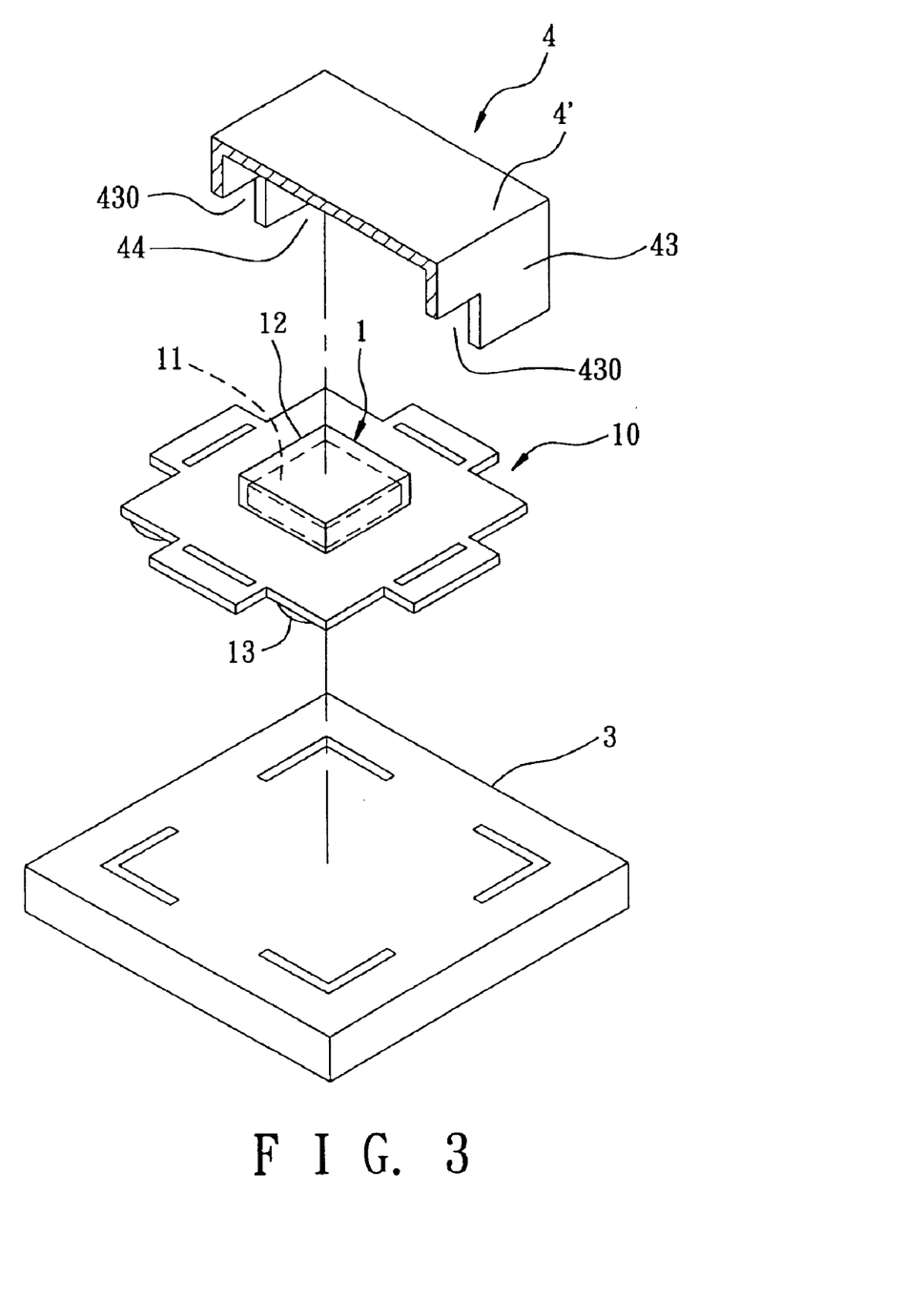
FIG. 3 is an exploded perspective, partly cutaway view of the first embodiment.
Figure 4:
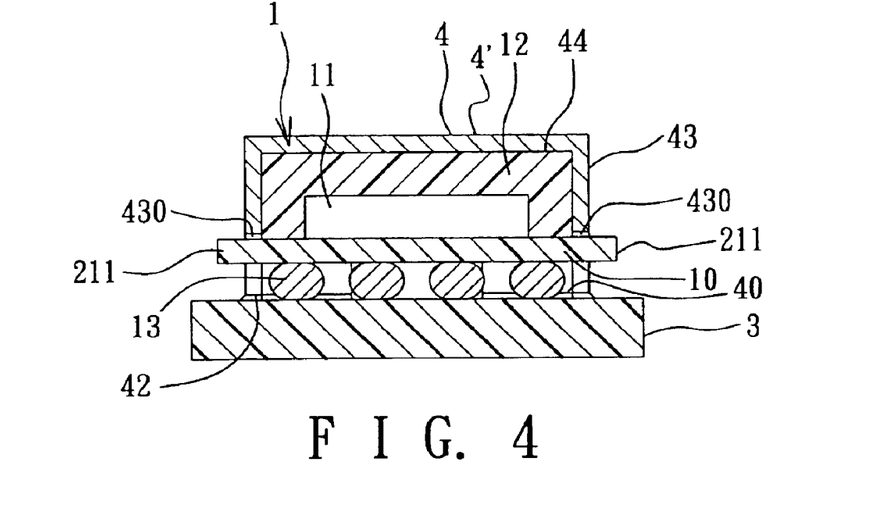
FIG. 4 is a sectional view of the first embodiment.

FIGS. 2 to 4 illustrate the first preferred embodiment of an electronic device according to the present invention. The electronic device includes a ball grid array (BGA) package connected electrically to a printed circuit board 3.

The BGA package includes: a chip 1 having a substrate 10 with opposite top and bottom surfaces, and a semiconductor die 11 mounted on the top surface of the substrate 10 and enclosed by an encapsulant 12; a plurality of solder bumps 13 projecting outwardly from the bottom surface of the substrate 10 and connected directly and electrically to the printed circuit board 3; and an electromagnetic shield 4 including a housing 4' that defines an inner space 44 which receives the chip 1 and the solder bumps 13 therein, and a bottom opening 40 for access into the inner space 44. The solder bumps 13 project outwardly of the inner space 44 through the bottom opening 40 in the housing 4' of the electromagnetic shield 4 so as to connect directly and electrically to the printed circuit board 3. The housing 4' has a bottom end 42 that defines the bottom opening 40 and that is connected directly to the printed circuit board 3 by welding, thereby permitting direct transmission of impact or stress acting on the electromagnetic shield 4 to the printed circuit board 3, which eliminates the aforesaid drawbacks encountered in the prior art.

In this embodiment, the housing 4' of the electromagnetic shield 4 has a peripheral wall 43 that surrounds the chip 1 and the solder bumps 13, that is rectangular in shape, and that is formed with four side openings 430 at four sides of the peripheral wall 43. The substrate 10 of the chip 1 is rectangular in shape, and has four tabs 211 projecting outwardly from four sides of the substrate 10 and extending transversely of the peripheral wall 43 of the housing 4' and respectively through the side openings 430 in the peripheral wall 43. The housing 4' of the electromagnetic shield 4 is connected directly to the tabs 211 of the substrate 10 of the chip 1 by welding.

The peripheral wall 43 of the housing 4' has a bottom end that defines the bottom end 42 of the housing 4'. Each of the side openings 430 in the peripheral wall 43 extends to the bottom end 42 of the peripheral wall 43.

Figure 5:
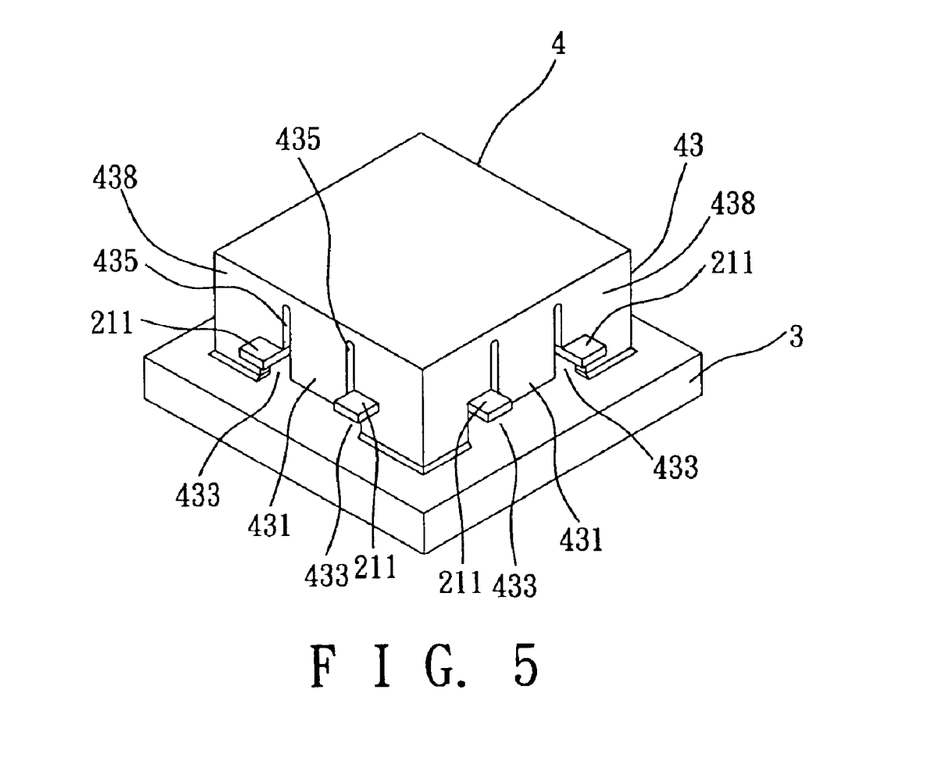
FIG. 5 is a schematic perspective view of the second preferred embodiment of the ball grid array package according to the present invention, with the printed circuit board connected electrically thereto.
Figure 6:
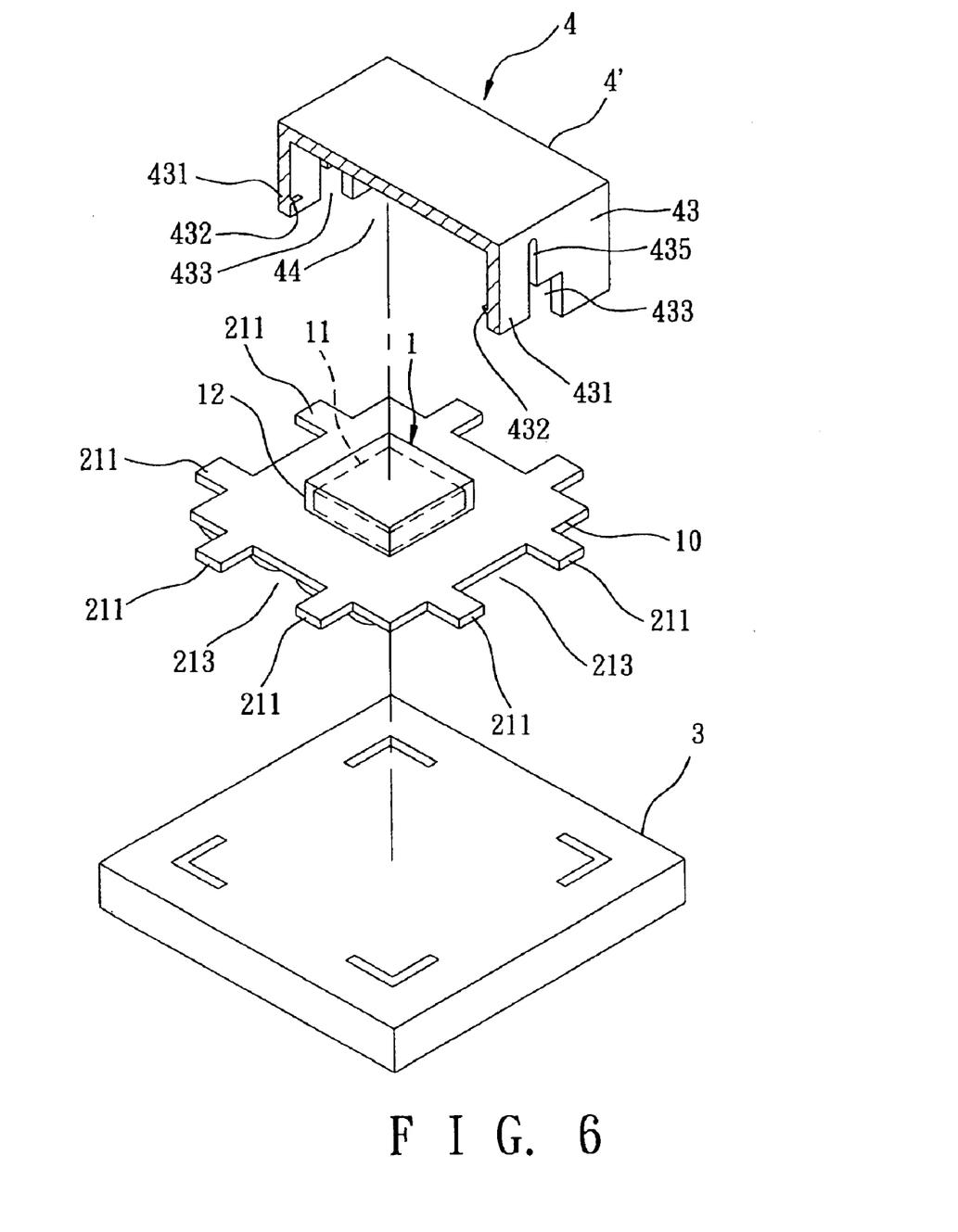
FIG. 6 is an exploded perspective, partly cutaway view of the second embodiment.
Figure 7:
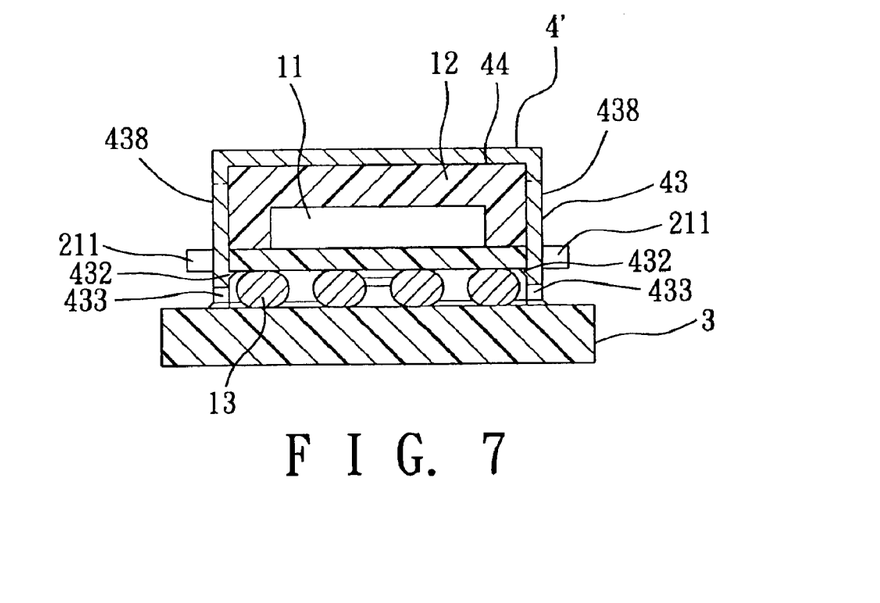
FIG. 7 is a sectional view of the second embodiment.

FIGS. 5 to 7 illustrate the second preferred embodiment of the electronic device according to the present invention.

The electronic device of this embodiment differs from the previous embodiment in that the peripheral wall 43 of the housing 4' has a top end, a bottom end opposite to the top end and defining the bottom end 42 of the housing 4', and four side wall portions 438, each of which is formed with two opposite first recesses 433 extending to the bottom end of the peripheral wall 43, and two opposite vertical slits 435 disposed between the first recesses 433 and extending from the bottom end of the peripheral wall 43 toward the top end of the peripheral wall 43 so as to form a flexible part 431 therebetween. The substrate 10 has four sides, each of which is formed with two opposite lateral tabs 211 that project outwardly therefrom so as to form a second recess 213 in the side of the substrate 10 therebetween and that extend transversely of the peripheral wall 43 of the housing 4' and respectively through the first recesses 433 in a respective one of the side wall portions 438 of the peripheral wall 43. The flexible part 431 of each of the side wall portions 438 of the peripheral wall 43 extends into the second recess 213 in a respective one of the sides of the substrate 10.

In this embodiment, the flexible part 431 of each of the side wall portions 438 of the peripheral wall 43 of the housing 4' is formed with a stop 432 that projects into the inner space 44 of the housing 4' of the electromagnetic shield 4. Each of the sides of the substrate 10 is supported on the stop 432 on the flexible part 431 of the respective one of the side wall portions 438 of the peripheral wall 43.

Figure 8:
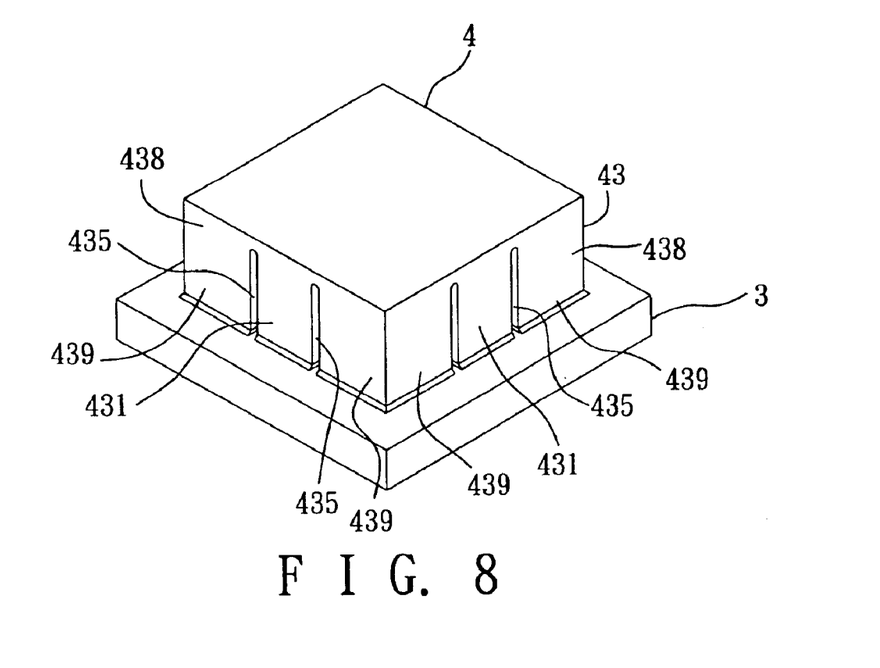
FIG. 8 is a schematic perspective view of the third preferred embodiment of the ball grid array package according to the present invention, with the printed circuit board connected electrically thereto.
Figure 9:
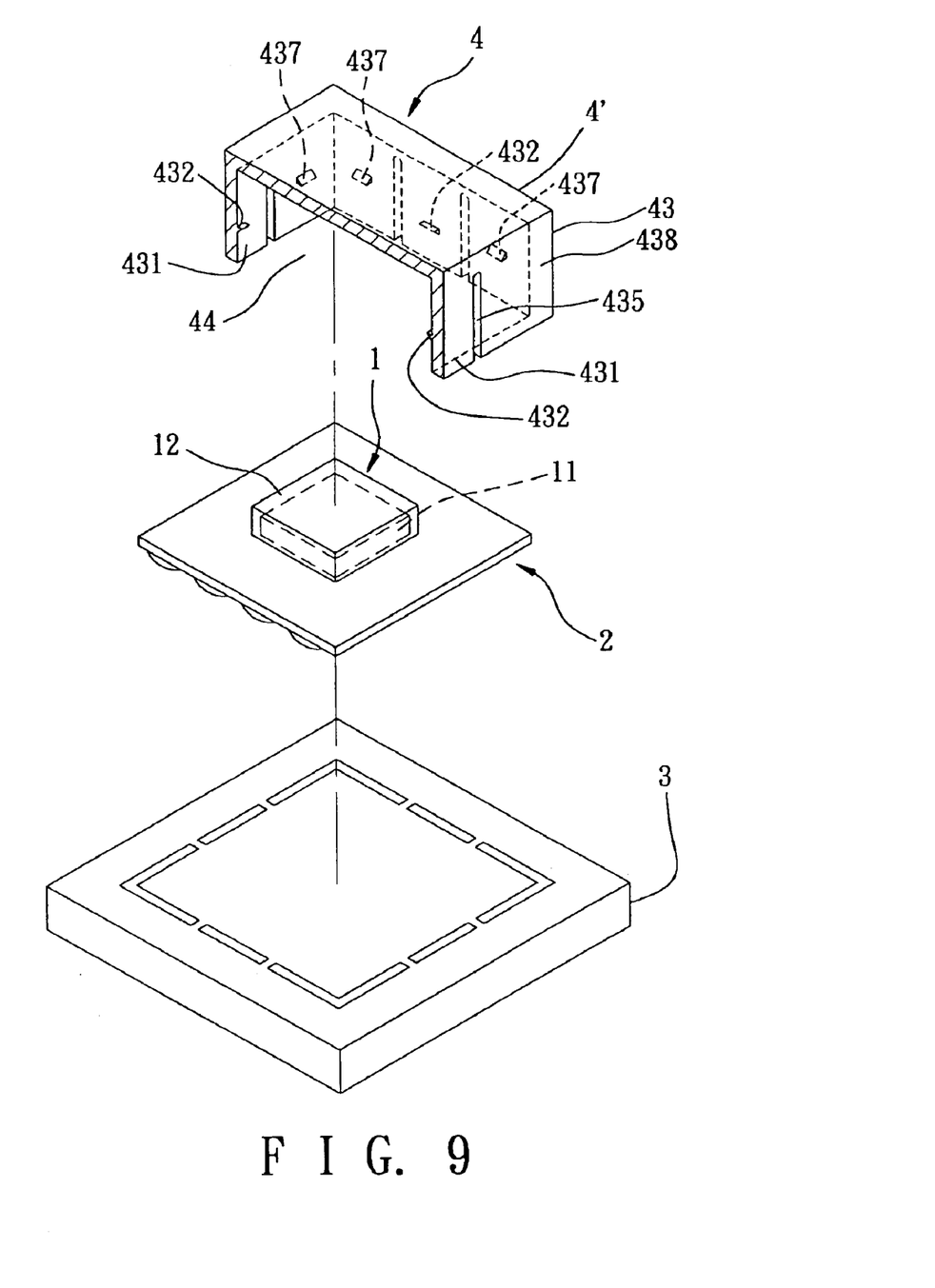
FIG. 9 is an exploded perspective, partly cutaway view of the third embodiment.
Figure 10:
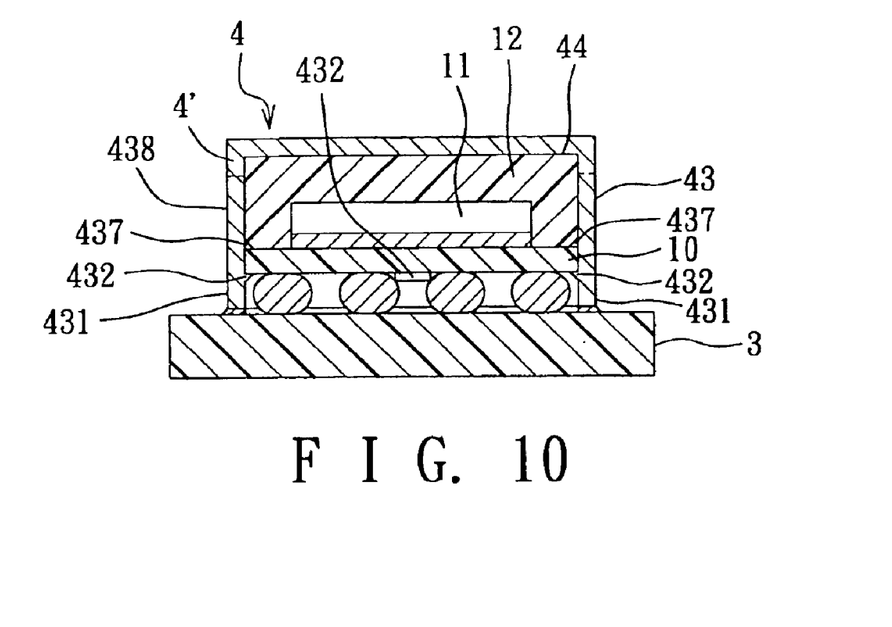
FIG. 10 is a sectional view of the third embodiment.

FIGS. 8 to 10 illustrate the third preferred embodiment of the electronic device according to the present invention. The electronic device of this embodiment differs from the first embodiment in that the peripheral wall 43 of the housing 4' has a top end, a bottom end opposite to the top end and defining the bottom end 42 of the housing 4', and four side wall portions 438, each of which is formed with two opposite vertical slits 435 extending from the bottom end of the peripheral wall 43 toward the top end of the peripheral wall 43 so as to divide the side wall portion 438 into two opposite end parts 439 and a flexible middle part 431 between the end parts 439. The flexible middle part 431 is formed with a stop 432 that projects into the inner space 44 in the housing 4'. Each of the end parts 439 is formed with a limiting protrusion 437 that projects into the inner space 44 in the housing 4' and that is disposed above the stop 432. The substrate 10 has top and bottom surfaces and four sides, each of which is supported on the stop of the flexible part 431 of a respective one of the side wall portions 438 of the peripheral wall 43. The stop 432 on the flexible part 431 of each of the side wall portions 438 of the peripheral wall 43 contacts the bottom surface of the substrate 10, whereas the limiting protrusion 437 on each end part 439 contacts the top surface of the substrate 10 so as to confine the substrate 10 in a space defined by the stops 432 on the flexible parts 431 and the limiting protrusions 437 on the end parts 439.

Figure 11:
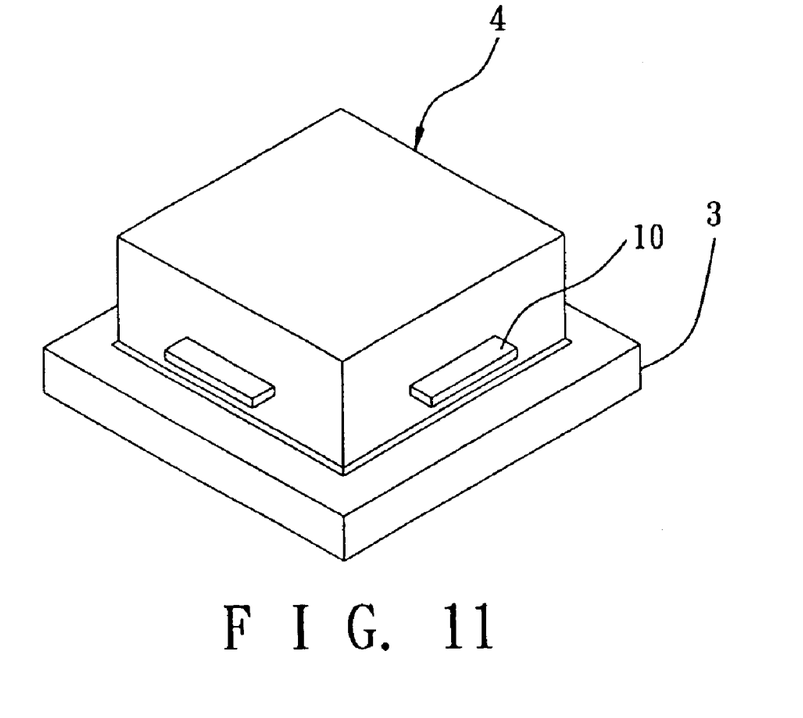
FIG. 11 is a schematic perspective view of the fourth preferred embodiment of the ball grid array package according to the present invention, with the printed circuit board connected electrically thereto.
Figure 12:
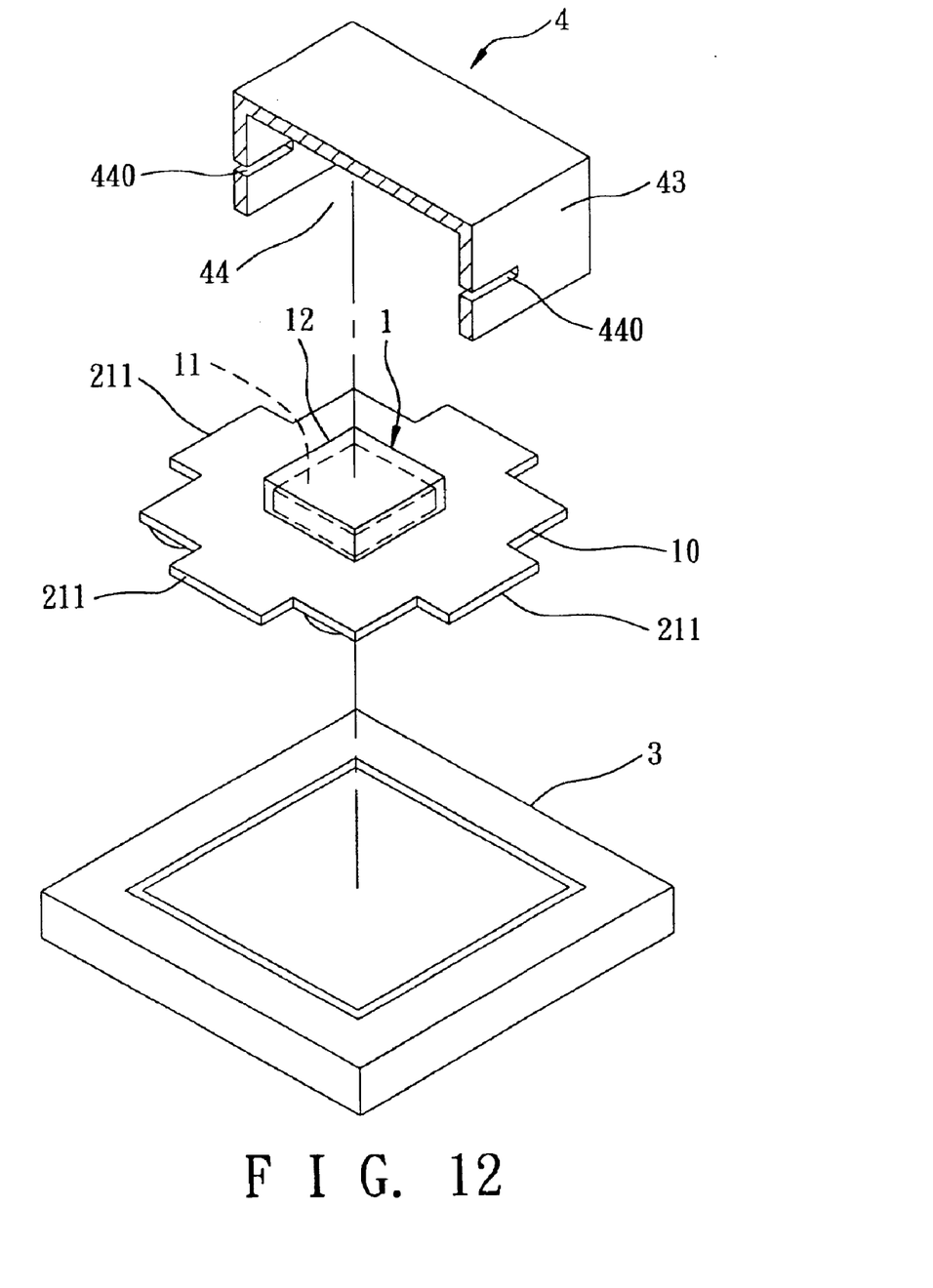
FIG. 12 is an exploded perspective, partly cutaway view of the fourth embodiment.
Figure 13:
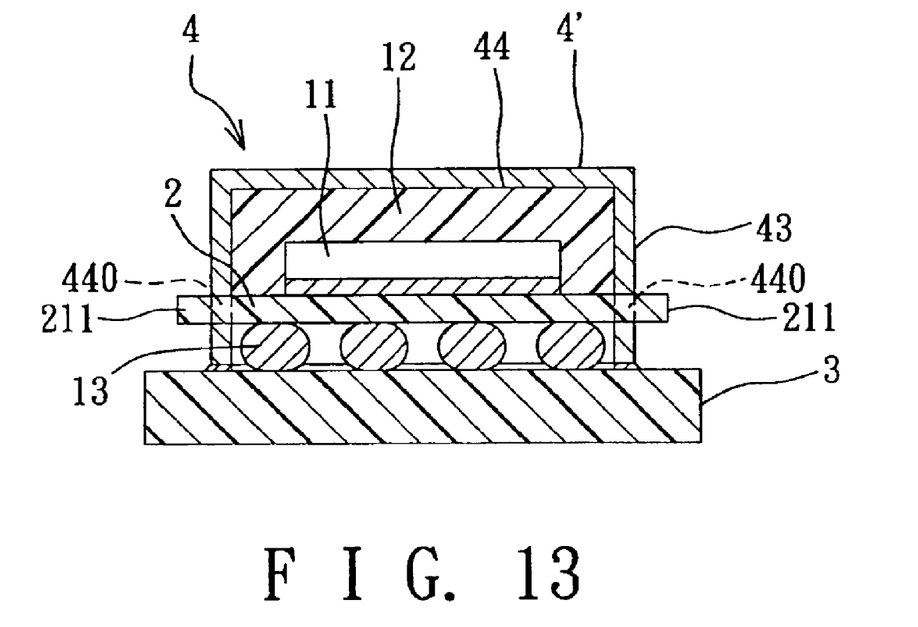
FIG. 13 is a sectional view of the fourth embodiment.

FIGS. 11 to 13 illustrate the fourth preferred embodiment of the electronic device according to the present invention. The electronic device of this embodiment differs from the first embodiment in that the peripheral wall 43 has a top end and a bottom end opposite to the top end and defining the bottom end 42 of the housing 4', and is formed with four slots 440 at four sides of the peripheral wall 43 between the top and bottom ends of the peripheral wall 43. The substrate 10 of the chip 1 has four tabs 211 projecting outwardly therefrom and extending transversely of the peripheral wall 43 of the housing 4' and fittingly and respectively through the slots 440 in the peripheral wall 43. The substrate 10 is flexible, and is bent in such a manner so as to permit extension of the tabs 211 through the respective slots 440.

By virtue of the direct connection of the electromagnetic shield 4 of the BGA package of this invention to the printed circuit board 3, the aforesaid drawbacks encountered in the prior art can be eliminated.

With the invention thus explained, it is apparent that various modifications and variations can be made without departing from the spirit of the present invention.

I claim:

1. A ball grid array package comprising:
   a chip including a substrate with a bottom surface;
   a plurality of solder bumps projecting outwardly from said bottom surface of said substrate; and
   an electromagnetic shield including a housing that defines an inner space which receives said chip and said solder bumps therein, and a bottom opening for access into said inner space;
   wherein said solder bumps project outwardly of said inner space through said bottom opening in said housing;
   wherein said housing of said electromagnetic shield has a peripheral wall that surrounds said chip and said solder bumps; and
   wherein said peripheral wall is formed with at least one side opening, said substrate having a corresponding tab projecting outwardly therefrom and extending transversely of said peripheral wall through said side opening.

2. The ball grid array package of claim 1, wherein said housing of said electromagnetic shield is connected directly to said substrate of said chip.

3. The ball grid array package of claim 2, wherein said peripheral wall has a bottom end, said side opening extending to said bottom end.

4. The ball grid array package of claim 2, wherein said peripheral wall has a bottom end, two first recesses extending to said bottom end, and two vertical slits disposed between said first recesses to form a flexible part therebetween.

5. The ball grid array package of claim 4, wherein said flexible part is formed with a stop that projects into said inner space in said housing, said substrate being supported on said stop.

6. An electronic device comprising:
   a printed circuit board;
   a chip including a substrate with opposite top and bottom surfaces, and a semiconductor die mounted on said top surface of said substrate;
   a plurality of solder bumps projecting outwardly from said bottom surface of said substrate and connected directly and electrically to said printed circuit board; and
   an electromagnetic shield including a housing that defines an inner space which receives said chip and said solder bumps therein, and a bottom opening for access into said inner space, said housing having a bottom end that defines said bottom opening and that is connected directly to said printed circuit board;
   wherein said solder bumps project outwardly of said inner space through said bottom opening in said housing;
   wherein said housing of said electromagnetic shield has a peripheral wall that surrounds said chip and said solder bumps; and
   wherein said peripheral wall is formed with at least one side opening, said substrate having corresponding tab projecting outwardly therefrom and extending transversely of said peripheral wall through said side opening.

7. The electronic device of claim 6, wherein said housing of said electromagnetic shield is connected directly to said substrate of said chip.

* * * * *